(12) United States Patent
Lee et al.

(10) Patent No.: US 6,709,986 B2
(45) Date of Patent: Mar. 23, 2004

(54) METHOD FOR MANUFACTURING SEMICONDUCTOR MEMORY DEVICE BY USING PHOTORESIST PATTERN EXPOSED WITH ARF LASER BEAM

(75) Inventors: Sung-Kwon Lee, Ichon (KR); Sang-Ik Kim, Ichon (KR); Weon-Joon Suh, Ichon (KR); Min-Seok Lee, Ichon (JP); Kuk-Han Yoon, Ichon (KR)

(73) Assignee: Hynix Semiconductor Inc., Hyoungki-do (KR)

( * ) Notice: Subject to any disclaimer, the term of this patent is extended or adjusted under 35 U.S.C. 154(b) by 0 days.

(21) Appl. No.: 10/175,574

(22) Filed: Jun. 19, 2002

(65) Prior Publication Data

US 2003/0003659 A1 Jan. 2, 2003

(30) Foreign Application Priority Data

Jun. 28, 2001 (KR) .......................... 2001-37441
Dec. 17, 2001 (KR) .......................... 2001-80235

(51) Int. Cl.[7] ..................... H10L 21/302; H10L 21/461
(52) U.S. Cl. ....................... 438/706; 438/700
(58) Field of Search ................. 438/706, 637, 438/700, 771, 776, 792, 788, 789, 790, 795

(56) References Cited

U.S. PATENT DOCUMENTS

| 4,529,475 | A | * | 7/1985 | Okano et al. | 156/643 |
| 5,279,921 | A | * | 1/1994 | Onishi et al. | 430/270 |
| 6,395,434 | B1 | * | 5/2002 | Nozawa et al. | 430/5 |
| 6,420,271 | B2 | * | 7/2002 | Sato et al. | 438/700 |

* cited by examiner

*Primary Examiner*—David Nhu
(74) *Attorney, Agent, or Firm*—Marshall, Gerstein & Borun LLP

(57) ABSTRACT

A method for manufacturing a semiconductor memory device includes the steps of forming a mask layer on a target layer to be etched, coating a photoresist on the mask layer, exposing the photoresist by using a light resource whose wavelength is of about 157 nm to 193 nm, forming a photoresist pattern by developing the photoresist, forming a mask pattern by selectively etching the mask layer with an etching gas except of fluorine-based gases by using the photoresist pattern as an etching mask; and selectively etching the target layer by using the mask pattern as an etching mask.

18 Claims, 5 Drawing Sheets

METHOD FOR MANUFACTURING SEMICONDUCTOR MEMORY DEVICE BY USING PHOTORESIST PATTERN EXPOSED WITH ARF LASER BEAM

FIELD OF THE INVENTION

The present invention relates to a semiconductor memory device, and more particularly a method of manufacturing a semiconductor memory device using a photoresist pattern formed by an argon fluoride (ArF) laser or a fluorine ($F_2$) laser as a light source.

DESCRIPTION OF RELATED ART

In the semiconductor memory device fabrication processes, photolithography is used to form patterns on a substrate with various materials. A photoresist, which is generally organic film forming polymers, is coated on a target layer, and exposed with a mask to induce photo-reaction in the photoresist, selectively. Then, the photoresist is developed and predetermined photoresist patterns are obtained. The photoresist patterns are mainly used as etch barriers during etching the target layer.

The photolithography has been moved ahead grew by leaps and bounds, from the beginning of mass production of dynamic random access memory (DRAM) which is representative of the semiconductor memory device.

The development of photolithography has been accomplished by the development in the every filed of an exposing system, a photoresist material, a mask and a process. The advent of a lens having high numerical aperture and an alignment device in the field of the exposing, a chemically amplified resist (CAR) in field of the photoresist material, a phase shift mask and an optical proximity correction in the field of the mask and method using a tri-layer-resist, a bi-layer-resist, a top-surface-imaging and an anti-reflection-coating in the field of the process, serve as good example, respectively.

The initial exposure equipment is a contact printer, where a mask is directly contacted with a substrate and aligned by an operator who looks directly at the mask and the substrate with the naked eye. The contact printer had been developed to reduce the gap between the mask and substrate, and a proximity printer is developed. The proximity printer classified into a soft contact and a hard contact according to the amount of the gap.

In the photolithography, the resolution is inverse proportion to wavelength of the light source. The early stepper adopting step and repeat method, the wavelength of light source has been shortened from 436 nm, i. e. g-line, to 365 nm, i.e. i-line. A stepper and another exposing system, such as a scanner type exposing device, using a deep ultra violet(DUV), for example, 248 nm of KrF excimer laser, have been developed.

Photoresist patterns of which critical dimension(CD) are not more than 0.15 μm can be formed owing to the developments of an exposing device, photoresist material and other techniques used in the photolithography process.

It can be expected to form photoresist patterns of which CD are not more than 0.11 μm by using a deep ultra violet(DUV), i.e. 193 nm of KrF excimer laser.

In case of using the DUV, the resolution and the depth of focus (DOF) are improved compared to the case of using i-line. However, it is difficult to control process conditions. In the photolithography using the DUV, the difficulties are caused by an optical problem owing to use of light source having short wavelength and a chemical problem owing to the use of the CAR. As the wavelength become shorter, the effect of CD swing becomes a serious problem because of the effect of standing wave. The effect of CD swing is a phenomenon of periodic variation of line width of the photoresist pattern, and the effect of CD swing is caused by the variation of the extent of interference between incident light and reflective light, which varies by a trifle thickness difference of the photoresist film or the sub-layer. In the photolithography process using the DUV as the light source, the CAR should be used to improve sensitivity, however the problems of the stability of post exposure delay (PED) and the dependence on the sub-layer are generated owing to the reaction mechanism of the CAR.

The main problem of the lithography using the ArF laser as a light source is a development of new photoresist material. The photoresist for the ArF laser is also one kind of CAR, as the photoresist for the KrF, however the benzene rings should not be contained in the photoresist for ArF laser. The benzene rings have been used for improving barrier characteristic of the photoresist for i-line and KrF laser in the dry etching. In case that the benzene rings are in the photoresist for ArF laser, the absorption rate increases in the 193 nm, which is the wavelength of the ArF laser, that is, the transparent rate decrease, accordingly, it is difficult to expose the photoresist to the bottom thereof. Therefore, it is need to develop a photoresist having high barrier characteristic without the benzene rings.

However, a photoresist having a CycloOlefin-Maleic Anhydride (COMA), a photoresist having Acrylate species and a photoresist containing both the COMA and the Acrylate species, which have been used for ArF laser, have the benzene rings therein.

Accordingly, in case of forming photoresist patterns by exposing the photoresist, in which the benzene rings are contained, with the ArF laser, the deformation or lumping of the photoresist patterns is generated when an etch process using fluorine-based gas as an etching gas is carried out.

Therefore, it is need to supplement the physical characteristic of the photoresist pattern, in which the benzene rings are contained and formed by exposing with the ArF laser, in order to improve barrier characteristic of the photoresist patterns in the etch process using the fluorine-based gas.

SUMMARY OF THE INVENTION

It is, therefore, an object of the present invention to provide a method for manufacturing a semiconductor memory device using a photoresist pattern formed by an argon fluoride (ArF) laser as a light source.

In accordance with an aspect of the present invention, there is a provided a method for manufacturing a semiconductor memory device, comprising the steps of: a) forming a mask layer on a target layer to be etched; b) coating a photoresist on the mask layer; c) exposing the photoresist by using a light resource whose wavelength is of about 157 nm to 193 nm; d) forming a photoresist pattern by developing the photoresist; e) forming a mask pattern by selectively etching the mask layer with an etching gas except fluorine-based gases by using the photoresist pattern as an etching mask; and f) selectively etching the target layer by using the mask pattern as an etching mask.

In accordance with another aspect of the present invention, there is provided a method for manufacturing a semiconductor memory device, comprising the steps of: a) forming a mask layer on an interlayer insulating layer overlying a semiconductor substrate; b) coating a photoresist on the mask layer; c) exposing the photoresist by using a light resource whose wavelength is of about 157 nm to about 193 nm; e) forming a photoresist pattern by developing the photoresist; f) forming a mask pattern by selectively etching the mask layer with an etching gas except a fluorine-based gas by using the photoresist pattern as an etching mask; g) forming a contact hole exposing the semiconductor substrate by selectively etching the interlayer insulating layer by using the mask pattern as an etching mask; h) forming a conductive layer on the interlayer insulating layer including the contact hole; and i) forming a plug by etching the conductive layer and the mask pattern until the interlayer insulating layer is exposed as the conductive remains only in the contact hole.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE DRAWINGS

Hereinafter, a method for manufacturing a semiconductor memory device using a photoresist pattern formed by an argon fluoride (ArF) laser as a light source according to the present invention will be described in detail referring to the accompanying drawings.

FIGS. 1A to 1E are cross-sectional views showing a process forming a contact hole by using a photoresist pattern as an etching mask, which is formed by an argon fluoride (ArF) laser beam or a fluorine ($F_2$) laser beam as a light source in accordance with a first embodiment of the present invention.

Figure 1A:
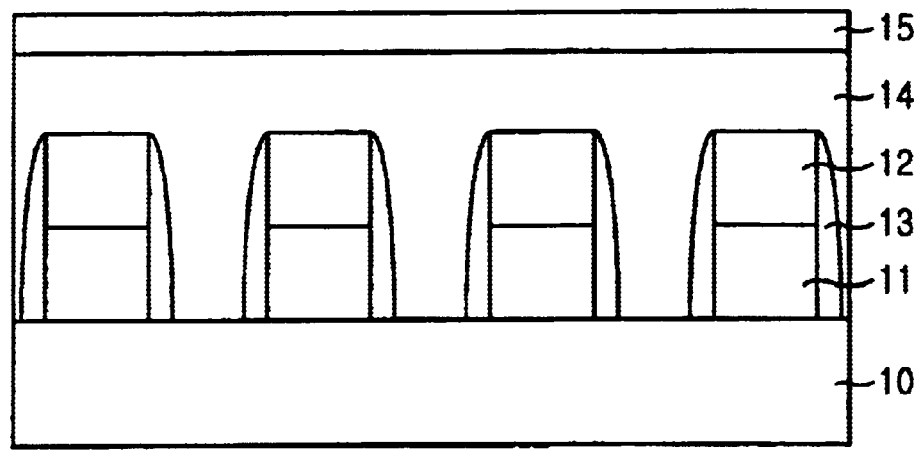
FIGS. 1A to 1E are cross-sectional views showing a process for fabricating a semiconductor device in accordance with a first embodiment of the present invention.

Referring to FIG. 1A, a gate electrode 11 as an example of a neighboring conductive pattern is formed on a semiconductor substrate 10. A hard mask 12 and a spacer 13 are formed on the top and lateral sides of the gate electrode 11, respectively and then an interlayer insulating layer 14 is deposited on the entire structure. The hard mask 12 and the spacer 13 are formed with a nitride layer, and the interlayer insulating layer 14 is formed with an oxide of advanced planarization layer, a boro phospho silicate(BPSG), a spin on glass(SOG), a high density plasma oxide or a nitride layer in the preferred embodiment of the present invention.

Subsequently, a mask layer 15 is formed on the interlayer insulating layer 14. The mask layer 15 is formed by depositing polysilicon, which has a good etching ratio for chlorine-based gases, at a thickness of about 500 Å to about 200 Å.

Next, a photoresist is coated on the mask layer 15 and exposed with a mask to induce photo-reaction in the photoresist by using an ArF laser beam or a fluorine ($F_2$) laser beam as a light source. Then, the photoresist is developed and predetermined photoresist patterns are obtained, so that a predetermined portion of the mask layer 15 is exposed.

Figure 1B:
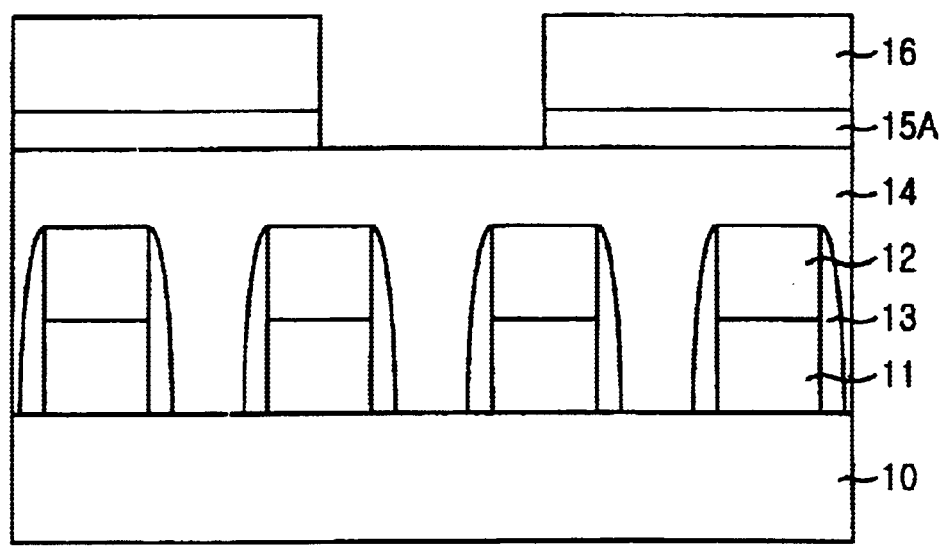

Referring to FIG. 1B, the exposed mask layer 15 is selectively etched by using the chlorine-based gas, such as a gas of $Cl_2$, $Cl_3$, $BCl_3$, HCl, HBr, $SiCl_4$ or the like, to expose a portion of the interlayer insulating layer 14, so that a contact hole is defined and a mask pattern 15A is formed. The present invention employs an advantage that the photoresist pattern 16, which is formed by being exposed to the light source having wavelength of about 157 nm to 193 nm, such as the ArF laser beam or the $F_2$ laser beam, has a good etching resistance against the chlorine-based gas rather than that of the fluorine-based gas, so that, in an etching process using the photoresist as an etching barrier, since the chlorine-based etching gas is employed, deformation of the photoresist pattern, which is caused by the etching process, can be reduced.

Figure 1C:
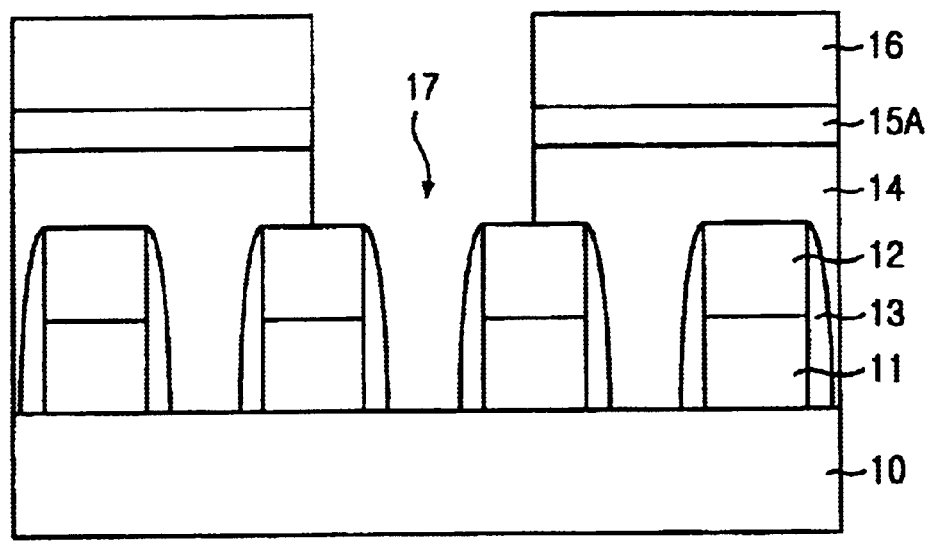

Referring to FIG. 1C, before the photoresist pattern 16 is removed, the exposed interlayer insulating layer 14 is selectively etched by the photoresist pattern 16 and the mask pattern 15A as an etching mask, so that a contact hole 17 is formed to expose a surface of the semiconductor substrate 10 between the gate electrodes. At this time, the etching process is carried out by using a gas of $C_xF_y$ (x is from 1 to 10 and y is from 1 to 10) $C_xH_yF_z$ (x is from 1 to 10 and y is from 1 to 10), $O_2$, Co or a mixture gas thereof as an etching gas. Thereafter, the photoresist pattern 16 is removed. The etching process of the interlayer insulating layer 14 can be performed before the photoresist pattern 16 is removed.

Figure 1D:
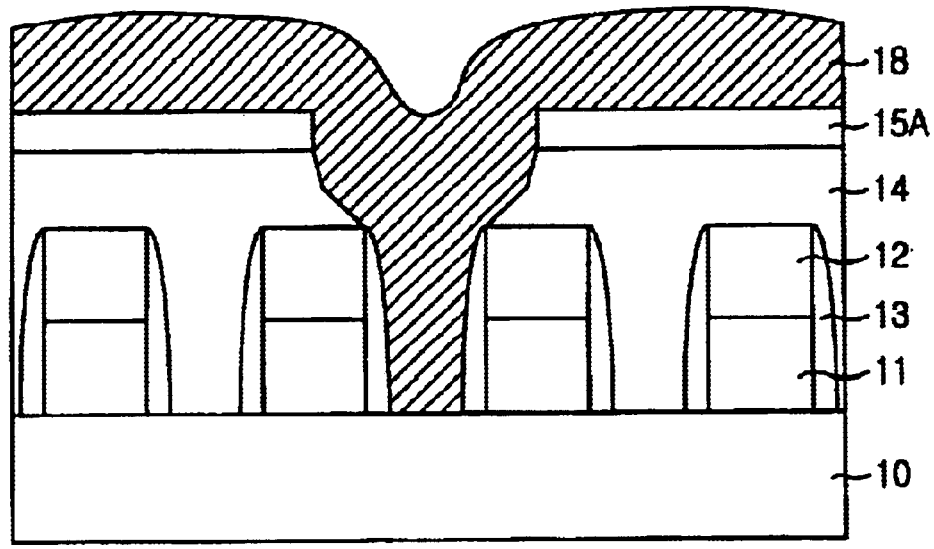
Figure 1E:
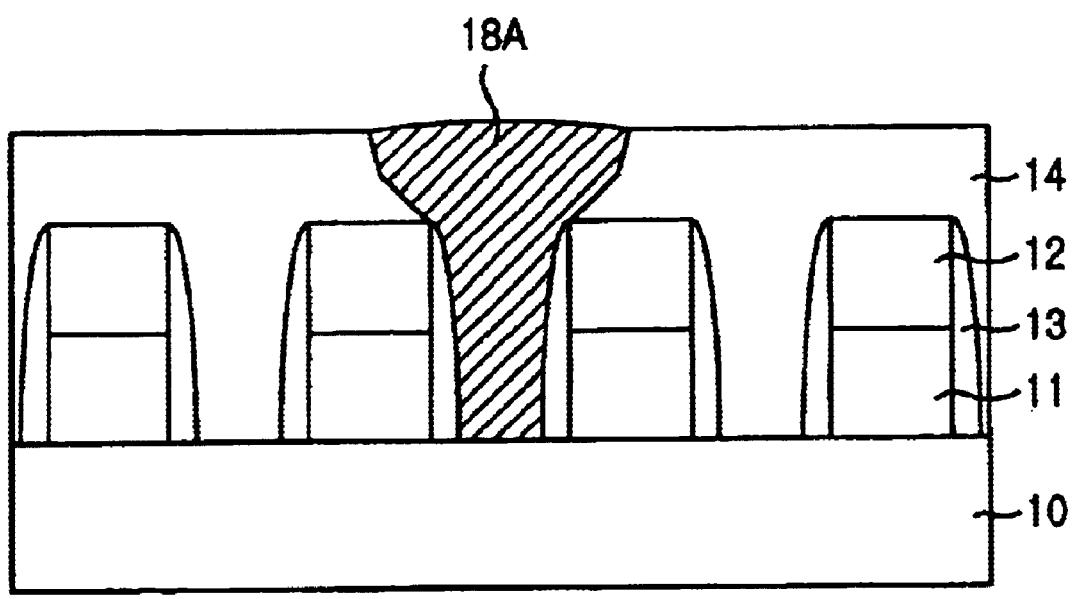

Referring to FIG. 1D, a polysilicon layer 18 is deposited on the entire structure to be filled in the contact hole 17 and then a chemical mechanical polishing process or an etch back process is carried out for the polysilicon layer 18 and the mask pattern 15A until the interlayer insulating layer 14 is exposed, so that a polysilicon plug 18A is formed as shown in FIG. 1E.

FIGS. 2A to 2D are cross-sectional views showing a process forming a contact hole by using a photoresist pattern as an etching mask, which is formed by an argon fluoride (ArF) laser beam or a fluorine ($F_2$) laser beam whose wavelength are of 157 nm to 193 nm as a light source in accordance with a second embodiment of the present invention.

Figure 2A:
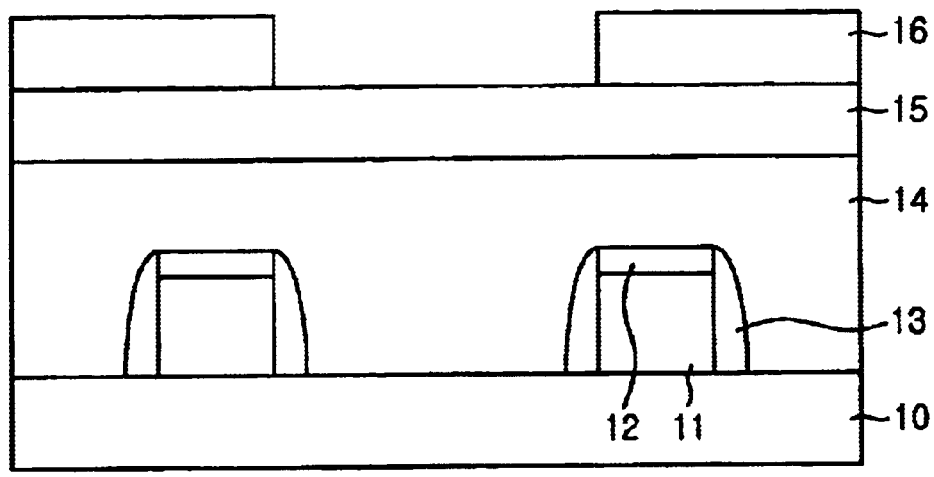
FIGS. 2A to 2D are cross-sectional views showing a process for fabricating a semiconductor device in accordance with a second embodiment of the present invention.

Referring to FIG. 2A, a gate electrode 11 as an example of a neighboring conductive pattern is formed on a semiconductor substrate 10. A hard mask 12 and a spacer 13 are formed on the top and lateral sides of the gate electrode 11, respectively, and then an interlayer insulating layer 14 is formed on the entire structure. The hard mask 12 and the spacer 13 are formed with a nitride layer and the interlayer insulating layer 14 is formed with advanced planarization layer (APL) oxide, boro phospho silicate glass (BPSG), spin on glass (SOG) or high density plasma (HDP) oxide.

Subsequently, a mask layer 20 is formed with an organic material at a thickness of 500 Å to 3000 Å on the interlayer insulting layer 14. The mask layer 20, also, further plays a role of a reflection protection layer.

Next, a photoresist is coated on the mask layer 20 and exposed with a mask to induce photo-reaction in the photoresist by using the light source of the ArF Laser beam or the $F_2$ laser beam. Then, the photoresist is developed and a photoresist patterns are obtained, so that a predetermined portion of the mask layer 15 is exposed.

A process forming the photoresist 16 will be described.

The photoresist for the ArF laser, such as COMA (CycloOlefin-maleic anhydride) or Acrylate, is coated on the mask layer 20 at a thickness of 1000 Å to 5000 Å and then, before an exposure process, an electron beam irradiation process or an Ar ion implantation process may be additionally carried out to harden tolerance of the photoresist pattern 16.

Figure 2B:
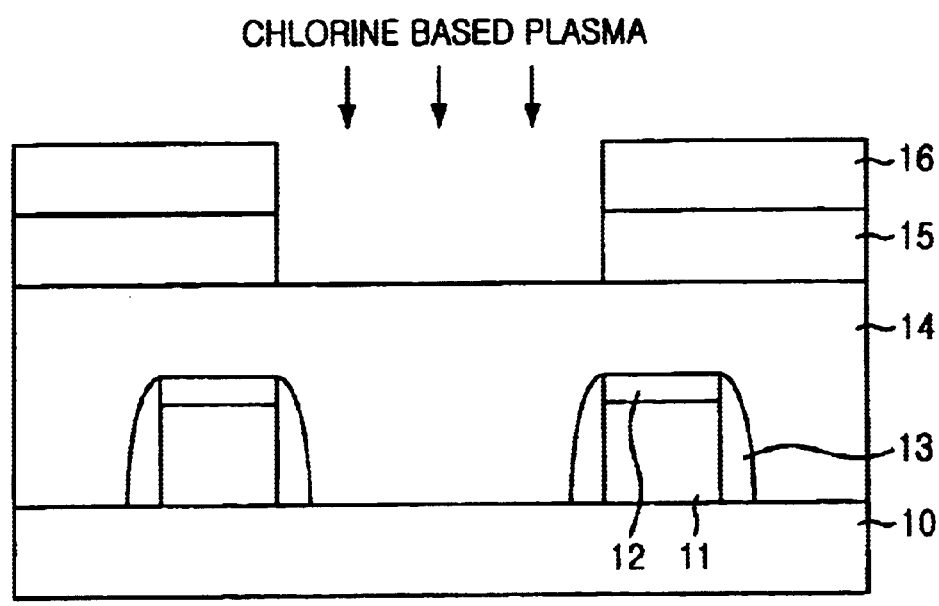

Referring to FIG. 2B, the exposed mask layer 20 is removed by selectively performing an etching process using a chlorine-based etching gas, such as a gas of $Cl_2$, $SiCl_4$, HCl, HBr or $SiCl_4$ with maintaining the substrate 10 in a temperature of about −40° C. to about 30° C., so that the interlayer insulating layer 14 is exposed and an region for forming a contact hole is defined. Also, a mask pattern 20A is formed. At this time, a gas of $N_2$ $O_2$, Ar, He or Xe can be added into the chlorine-based gas.

Figure 2C:
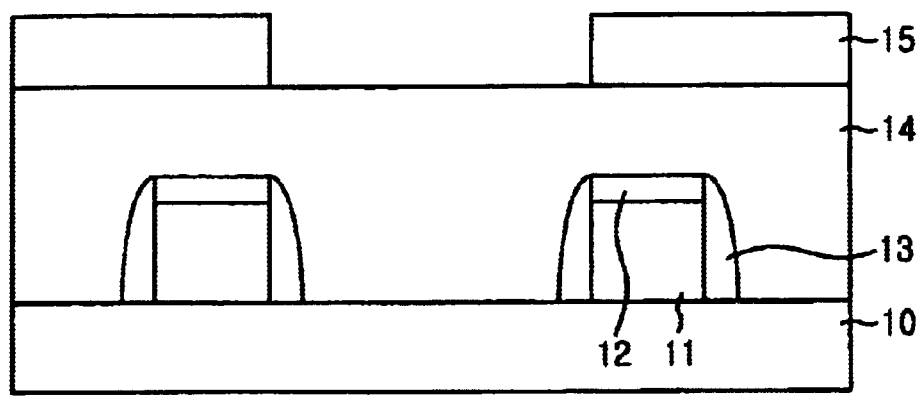

As shown in FIG. 2C, the photoresist pattern 16 is removed.

Figure 2D:
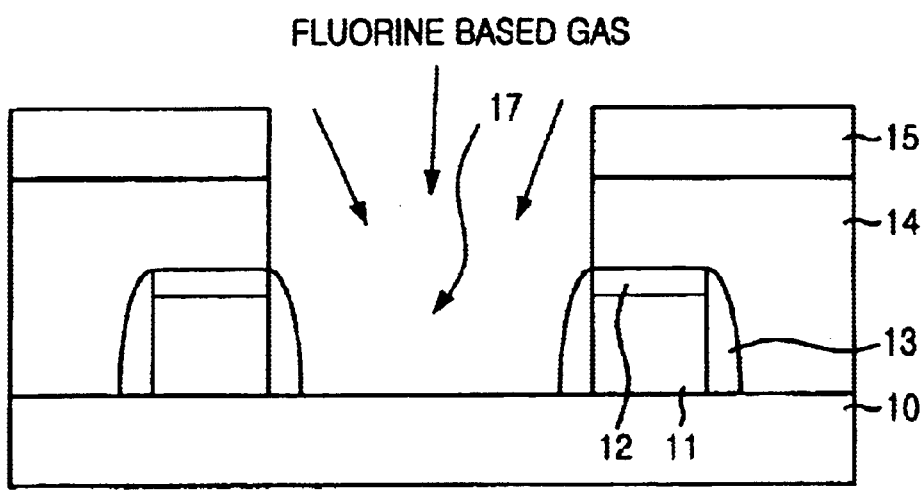

Referring to FIG. 2D, as the exposed interlayer insulating layer 14 is selectively etched by using the mask pattern 20A as an etching mask, a contact hole 17 is formed to expose a surface of the semiconductor substrate 10 between the gate electrodes. At this time, a temperature of the semiconductor substrate 10 is maintained in about 20° C. to about 100° C. The etching process is carried out by using at least one gas selected from a group of fluorine-based gases including $C_xF_y$ (x is from 1 to 10 and y is from 1 to 10), $C_xH_yF_z$ (x is from 1 to 10 and y is from 1 to 10) and, also, the etching gas may include an argon gas, a helium gas or a mixture thereof.

Subsequently, a polymer, which is a by-product generated from the etching process, is removed by a cleaning process and then the mask pattern 20A is removed.

As mentioned in the above, since the mask pattern is formed with a polysilicon or an organic material, which has a high etching ratio for the chlorine-based gas and the interlayer insulating layer is etched by using the mask pattern as a etching barrier, a problem due to deformation of the photoresist pattern exposed to the ArF laser beam or the fluorine (F2) laser beam having wavelength of about 157 nm to about 193 can be prevented.

While the present invention has been described with respect to the particular embodiments, it will be apparent to those skilled in the art that various changes and modifications may be made without departing from the spirit and scope of the invention as defined in the following claims.

What is claimed is:

1. A method for manufacturing a semiconductor memory device, comprising the steps of:
   a) forming a mask layer on a target layer to be etched;
   b) coating a photoresist including at least one of COMA (CycloOlefin-Maleic Anhydride) and Acrylate on the mask layer;
   c) exposing the photoresist by using a light resource whose wavelength is of about 157 nm to 193 nm;
   d) forming a photoresist pattern by developing the photoresist;
   e) forming a mask pattern by selectively etching the mask layer with a chlorine-based etching gas by using the photoresist pattern as an etching mask; and
   f) selectively etching the target layer by using the mask pattern as an etching mask.

2. The method as recited in claim 1, wherein the mask layer is formed with polysilicon, TiN or Al.

3. The method as recited in claim 1, wherein the mask layer is formed with an organic material.

4. The method as recited in claim 1, wherein the light source as an ArF laser or a $F_2$ laser.

5. The method as recited in claim 1, wherein the photoresist includes at least one of COMA (CycloOlefin-Maleic Anhydride) and Acrylate.

6. The method as recited in claim 1, wherein, in the step e), the chlorine-based gas includes a gas of $Cl_2$, $Cl_3$, $BCl_3$, HCl, HBr or $SiCl_4$.

7. The method as recited in claim 1, wherein the step f) is carried out by using a fluorine-based etching gas including $C_xF_y$ (x is from 1 to 10 and y is from 1 to 10) and $C_xH_yF_z$ (x is from 1 to 10 and y is from 1 to 10).

8. The method as recited in claim 1, further comprising the step b1) hardening the photoresist after the step b) is carried out.

9. The method as recited in claim 8, wherein the step b1) is carried out by irradiating an electron beam into the photoresist.

10. The method as recited in claim 8, wherein the step b1) is carried out by implanting an Ar ion into the photoresist.

11. A method for manufacturing a semiconductor memory device, comprising the steps of:
    a) forming a mask layer on an interlayer insulating layer overlying a semiconductor substrate;
    b) coating a photoresist including at least one of COMA (CycloOlefin-Maleic Anhydride) and Acrylate on the mask layer;
    c) exposing the photoresist by using a light resource whose wavelength is of about 157 nm to about 193 nm;
    e) forming a photoresist pattern by developing the photoresist;
    f) forming a mask pattern by selectively etching the mask layer with a chlorine-based etching gas by using the photoresist pattern as an etching mask; and
    g) forming a contact hole exposing the semiconductor substrate by selectively etching the interlayer insulating layer by using the mask pattern as an etching mask;
    h) forming a conductive layer on the interlayer insulating layer including the contact hole; and
    i) forming a plug by etching the conductive layer and the mask pattern until the interlayer insulating layer is exposed as the conductive remains only in the contact hole.

12. The method as recited in claim 11, wherein the mask layer is formed with an organic material.

13. The method as recited in claim 11, wherein the conductive layer is formed with a polysilicon layer.

14. The method as recited in claim 11, wherein the photoresist includes at least one of COMA (CycloOlefin-Maleic Anhydride) and Acrylate.

15. The method as recited in claim 11, wherein the step f) is carried out by etching the mask layer by using a chlorine-based gas.

16. The method as recited in claim 11, wherein the interlayer insulating layer is formed with a layer of APL (advanced planarization layer) oxide, BPSG (boro phospho silicate glass), SOG (spin on glass) or HDP (high density plasma) oxide.

17. The method as recited in claim 11, wherein the interlayer insulating layer is etched by using a fluorine-based gas.

18. The method as recited in claim 11, wherein, in the step i), the conductive layer and the mask pattern are removed by an etch back process or a chemical mechanical polishing (CMP) process.

* * * * *